(12) United States Patent
Zhang et al.

(10) Patent No.: US 10,972,112 B1
(45) Date of Patent: Apr. 6, 2021

(54) 50%-DUTY-CYCLE CONSECUTIVE INTEGER FREQUENCY DIVIDER AND PHASE-LOCKED LOOP CIRCUIT

(71) Applicant: SHANGHAI HUALI MICROELECTRONICS CORPORATION, Shanghai (CN)

(72) Inventors: Ning Zhang, Shanghai (CN); Yuchun Liu, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days.

(21) Appl. No.: 16/857,617

(22) Filed: Apr. 24, 2020

(30) Foreign Application Priority Data

Nov. 25, 2019 (CN) .......................... 201911162944.8

(51) Int. Cl.
*H03L 7/183* (2006.01)
*H03L 7/193* (2006.01)
*H03K 23/70* (2006.01)
*H03K 21/08* (2006.01)

(52) U.S. Cl.
CPC ............. *H03L 7/193* (2013.01); *H03K 21/08* (2013.01); *H03K 23/70* (2013.01)

(58) Field of Classification Search
USPC ................................................. 327/156–158
See application file for complete search history.

(56) References Cited

U.S. PATENT DOCUMENTS

| | | | | |
|---|---|---|---|---|
| 7,071,743 B2 * | 7/2006 | Starr | ................ | H03K 19/17732 327/147 |
| 7,541,848 B1 * | 6/2009 | Masuda | ......... | H03K 19/018528 327/147 |
| 8,106,690 B2 * | 1/2012 | Sakaguchi | ................ | H03L 7/23 327/156 |
| 9,496,878 B2 * | 11/2016 | Choi | ...................... | H03K 21/00 |
| 9,590,637 B1 * | 3/2017 | Lau | ........................ | H03K 23/40 |
| 9,742,447 B2 * | 8/2017 | Izawa | .................. | H03C 3/0975 |
| 2006/0067454 A1 * | 3/2006 | Camuffo | ................. | H03L 7/193 375/376 |
| 2009/0180358 A1 * | 7/2009 | Kouzuma | .............. | G04G 3/022 368/201 |
| 2009/0212833 A1 * | 8/2009 | Mitsuishi | ............. | H03K 23/667 327/115 |
| 2010/0183066 A1 * | 7/2010 | Chen | ...................... | H03M 1/661 375/239 |

(Continued)

*Primary Examiner* — Adam D Houston
(74) *Attorney, Agent, or Firm* — Alston & Bird LLP

(57) ABSTRACT

Embodiments described herein relate to a 50%-duty-cycle consecutive integer frequency divider and a phase-locked loop circuit having the frequency divider. The frequency divider includes a consecutive integer frequency divider module having a non-50%-duty-cycle, wherein the module receives a clock signal CLK and an input control signal CB and outputs a consecutive frequency division clock signal CLK1 comprising a non-50% duty cycle; a D flip-flop module for receiving the clock signal CLK and the consecutive frequency division clock signal CLK1 and outputting at least one clock signal CLKx; and a logic OR gate module for receiving the consecutive frequency division clock signal CLK1 and the at least one clock signal CLKx, and outputting an output clock signal CLKout comprising a 50% duty cycle.

20 Claims, 4 Drawing Sheets

(56) References Cited

U.S. PATENT DOCUMENTS

| | | | |
|---|---|---|---|
| 2011/0109355 A1* | 5/2011 | Sakaguchi | H03L 7/0814 |
| | | | 327/157 |
| 2012/0074997 A1* | 3/2012 | Kim | H03L 7/1976 |
| | | | 327/157 |
| 2012/0235717 A1* | 9/2012 | Hirai | H03L 7/197 |
| | | | 327/156 |
| 2013/0147529 A1* | 6/2013 | Ganesan | H03L 7/1803 |
| | | | 327/156 |
| 2014/0084974 A1* | 3/2014 | Tang | H03L 7/0891 |
| | | | 327/154 |
| 2016/0105188 A1* | 4/2016 | Cho | H04B 5/0056 |
| | | | 375/374 |
| 2020/0084015 A1* | 3/2020 | Manian | H03L 7/095 |
| 2020/0127671 A1* | 4/2020 | Chou | H03L 7/0992 |

* cited by examiner

50%-DUTY-CYCLE CONSECUTIVE INTEGER FREQUENCY DIVIDER AND PHASE-LOCKED LOOP CIRCUIT

CROSS-REFERENCES TO RELATED APPLICATIONS

This application claims priority to Chinese patent application No. CN201911162944.8, filed at CNIPA on Nov. 25, 2019, and entitled "50%-duty cycle consecutive integer frequency divider and phase-locked loop", the disclosure of which is incorporated herein by reference in entirety.

TECHNICAL FIELD

The present disclosure relates to semiconductor integrated circuit (IC) designs, in particular to IC frequency divider.

BACKGROUND OF THE DISCLOSURE

In order to implement signal processing synchronization between different electronic components or devices, a system clock is usually used to time the devices for proper data or signal operations between different components or devices. The system clock is sometimes established by means of a phase-locked loop (PLL).

Therefore, phase-locked loop circuits are widely used in analog circuits, and M dividers, N dividers, and O dividers are used in the phase-locked loop circuits. Currently, consecutive frequency division are achieved using the M and N dividers, while duty cycle is a quotient of 1 and a frequency divisor of the M and N dividers, instead of the desired 50%. The O dividers can achieve 50%-duty-cycle frequency division, while only frequency division with divisors 1, 2, 4, 8, . . . , $2^{n-1}$ can be achieved, where n is a binary bit. With the development of technologies, demands for higher duty cycle frequency division from customers have become higher, limiting the use of phase-locked loops. For example, some customers require 50%-duty-cycle consecutive integer frequency division of the outputs of the phase-locked loops.

BRIEF SUMMARY

According to embodiments described herein, the frequency divider includes a consecutive integer frequency divider module having a non-50%-duty-cycle, wherein the module receives a clock signal CLK and an input control signal CB and outputs a consecutive frequency division clock signal CLK1 comprising a non-50% duty cycle; a D flip-flop module for receiving the clock signal CLK and the consecutive frequency division clock signal CLK1 and outputting at least one clock signal CLKx; and a logic OR gate module for receiving the consecutive frequency division clock signal CLK1 and the at least one clock signal CLKx, and outputting an output clock signal CLKout comprising a 50% duty cycle.

According to another embodiment described herein there is provided a phase-locked loop circuit. The phase-locked loop circuit, comprising: an N divider used for receiving a reference clock signal CLK_REF; a phase-frequency detector connected to an output terminal of the N divider and used for receiving an output signal of the N divider; a charge pump connected to an output terminal of the phase-frequency detector and used for receiving an output signal of the phase-frequency detector; a filter connected to an output terminal of the charge pump and used for receiving an output signal of the charge pump; a voltage-controlled oscillator connected to an output terminal of the filter and used for receiving an output signal of the filter; an M divider having an input terminal connected to an output terminal of the voltage-controlled oscillator and an output terminal connected to an input terminal of the phase-frequency detector and used for feeding back an output signal of the voltage-controlled oscillator to the phase-frequency detector; and a 50%-duty-cycle consecutive integer frequency divider having an input terminal connected to the output terminal of voltage-controlled oscillator and an output terminal outputting an output signal PLL_OUT of the phase-locked loop circuit.

Figure 1:
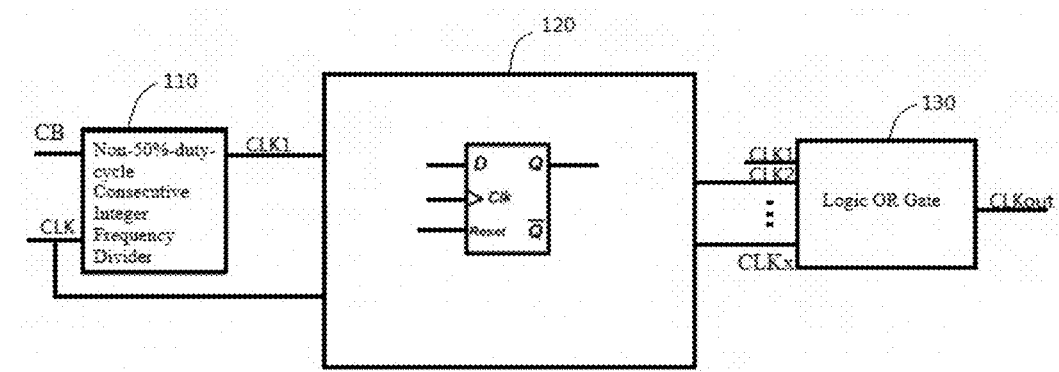
FIG. 1 is a schematic block diagram of a circuit of a 50%-duty-cycle consecutive integer frequency divider, according to one embodiment of the present disclosure.

Reference numerals of main components in the drawings are described as follows:
  110 non-50%-duty-cycle consecutive integer frequency divider;
  120 D flip-flop unit; and
  130 logic OR gate.

DETAILED DESCRIPTION OF THE DISCLOSURE

The technical solutions in the present disclosure will be clearly and completely described below with reference to the drawings. Obviously, the described embodiments are some of the embodiments of the present disclosure, but not all of the embodiments. Based on the embodiments of the present disclosure, all other embodiments obtained by a person of ordinary skill in the art without creative efforts shall fall within the protection scope of the present disclosure.

In one embodiment of the present disclosure, a 50%-duty-cycle consecutive integer frequency divider is described in FIG. 1. FIG. 1 is a schematic block diagram of a circuit of a 50%-duty-cycle consecutive integer frequency divider. As shown in FIG. 1, the 50%-duty-cycle consecutive integer frequency divider comprises: a non-50%-duty-cycle consecutive integer frequency divider 110 designed for receiving a clock signal CLK and an input control signal CB, and outputting a consecutive frequency division clock signal CLK1 which has a non-50% duty cycle; a D flip-flop unit 120 designed for receiving the clock signal CLK and the consecutive frequency division clock signal CLK1 having the non-50% duty cycle and outputting at least one clock signal CLKx, wherein x is an integer greater than 1; and a logic OR gate 130 designed for receiving the consecutive frequency division clock signal CLK1 with a non-50% duty cycle and at least one clock signal CLKx and outputting an output clock signal CLKout which has a 50% duty cycle.

Specifically, in this embodiment of the present disclosure, the clock signal CLK is a consecutive pulse clock signal which has a 50% duty cycle, at least one clock signal CLKx is a consecutive frequency division clock signal having a non-50% duty cycle, and the at least one clock signal CLKx is a clock signal obtained by delaying the consecutive frequency division clock signal CLK1 having a non-50% duty cycle.

Specifically, in one example of the embodiment, the frequency of the clock signal CLK is greater than the frequency of the consecutive frequency division clock signal CLK1 having a non-50% duty cycle, and also greater than the frequency of the at least one clock signal CLKx. The frequency of the output clock signal CLKout which is a 50% duty cycle is the same as the frequency of the consecutive frequency division clock signal CLK1 which has a non-50% duty cycle. Specifically, in one example of the embodiment, the frequency divisor of the non-50%-duty-cycle consecutive integer frequency divider 110 is the same as the frequency divisor of the 50%-duty-cycle consecutive integer frequency divider. Specifically, in one example of the embodiment, the frequency divisor of the non-50%-duty-cycle consecutive integer 110 frequency divider is controlled by the input control signal CB.

Specifically, in this embodiment, the D flip-flop unit 120 comprises at least one D flip-flop, the at least one D flip-flop in a cascaded connection; the first D flip-flop receives the consecutive frequency division clock signal CLK1 of a non-50% duty cycle and the clock signal CLK, which delays the consecutive frequency division clock signal CLK1 and outputs a first delayed clock signal CLK2. Each rear D flip-flop is connected to a front D flip-flop thereof, and it has a D input terminal for receiving an output signal from a Q terminal of the front D flip-flop thereof and it also receives the clock signal CLK, delays the output signal of the Q terminal of the front D flip-flop, and sequentially outputs second delayed clock signal CLK3, third delayed clock signal CLK4 and the $(X-1)^{th}$ delayed clock signal.

Specifically, in this embodiment, when the frequency divisor n of the 50%-duty-cycle consecutive integer frequency divider is an even number greater than 2, the number of the D flip-flops is (n−2)/2. More specifically, the D flip-flops of (n−2)/2 are rising-edge-triggered D flip-flops. Specifically, a Q output terminal of each rising-edge-triggered D flip-flop in the D flip-flop unit 120 is connected to an input terminal of the logic OR gate 130 through a switch (not shown here), to selectively output the first delayed clock signal CLK2 to the $(X-1)^{th}$ delayed clock signal CLKx to the logic OR gate 130, thereby implementing frequency division with divisors of different even numbers.

Specifically, when the frequency divisor n of the 50%-duty-cycle consecutive integer frequency divider is an odd number, the number of the D flip-flops is [(n−3)/2]+1, and n is an odd number greater than or equal to 3. More specifically, (n−3)/2 D flip-flops are rising-edge-triggered D flip-flops, and the single D flip-flop is a falling-edge-triggered D flip-flop. The falling-edge-triggered D flip-flop comprises a NOT gate and a rising-edge-triggered D flip-flop. The NOT gate receives and inverts the clock signal CLK, and then outputs the inverted clock signal to a clock signal terminal of the rising-edge-triggered D flip-flop. The NOT gate and the rising-edge-triggered D flip-flop constitute the falling-edge-triggered D flip-flop. The falling-edge-triggered D flip-flop is the last stage of the D flip-flop unit 120 and is used to output the $(X-1)^{th}$ delayed clock signal CLKx. The Q output terminal of each rising-edge-triggered D flip-flop in the D flip-flop unit 120 is connected to an input terminal of the logic OR gate 130 through a switch (also not shown here), to selectively output the first delayed clock signal CLK2 to the $(X-2)^{th}$ delayed clock signal CLKx−1 to the logic OR gate 130. And Q output terminals of all the rising-edge-triggered D flip-flops and an output terminal of the non-50%-duty-cycle consecutive integer frequency divider 110 are connected to a D input terminal of the falling-edge-triggered D flip-flop through a gating switch, to selectively input to the input terminal of the falling-edge-triggered D flip-flop. A clock signal outputted by the output terminal of one of all the rising-edge-triggered D flip-flops or the non-50%-duty-cycle consecutive integer frequency divider 110, thereby implementing the frequency division with divisors of various odd numbers.

Specifically, the number of the D flip-flops increases with the increase of the frequency divisor n of the 50%-duty-cycle consecutive integer frequency divider, where n is an integer greater than or equal to 2. Specifically, the frequency divisor of the 50%-duty-cycle consecutive integer frequency divider is n, n being an integer greater than or equal to 2. The number of the D flip-flops in a cascaded connection is (n−1)/2, the front D flip-flops of [(n−1)/2]−1 are rising-edge-triggered D flip-flops, and the last D flip-flop is a falling-edge-triggered D flip-flop which is a last stage of the D flip-flop unit 12. The Q output terminal of each D flip-flop in the D flip-flop unit 120 is connected to an input terminal of the logic OR gate 130 through a switch (not shown), to selectively output the first delayed clock signal CLK2 to the $(X-1)^{th}$ delayed clock signal CLKx which then input to the logic OR gate 130. A gating switch (not shown) is connected to a D input terminal of the falling-edge-triggered D flip-flop, to selectively connect any one of the first delayed clock signal from CLK2 to the $(X-1)^{th}$ delayed clock signal CLKx or the consecutive frequency division clock signal CLK1, thereby implementing frequency division with any different divisors, such as frequency division with a divisor of an even number or an odd number.

Figure 2:
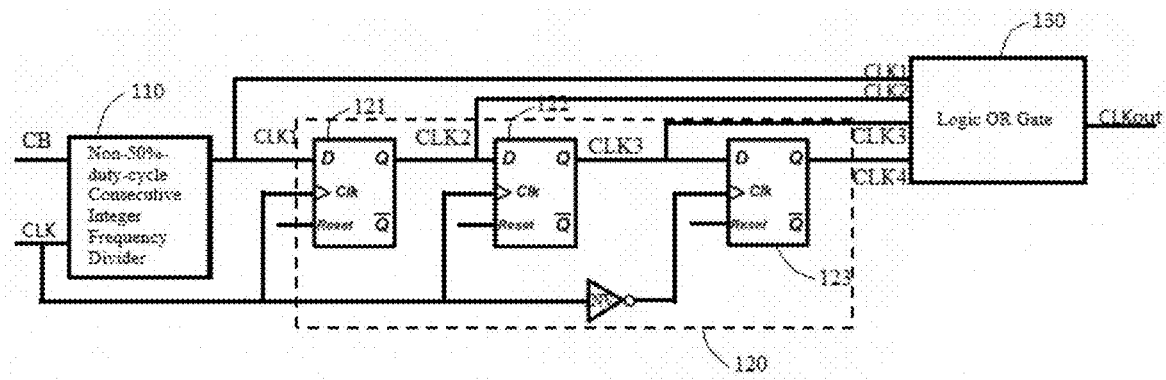
FIG. 2 is a schematic block diagram of a frequency divider circuit with a divisor 7, according to one embodiment of the present disclosure.
Figure 3:
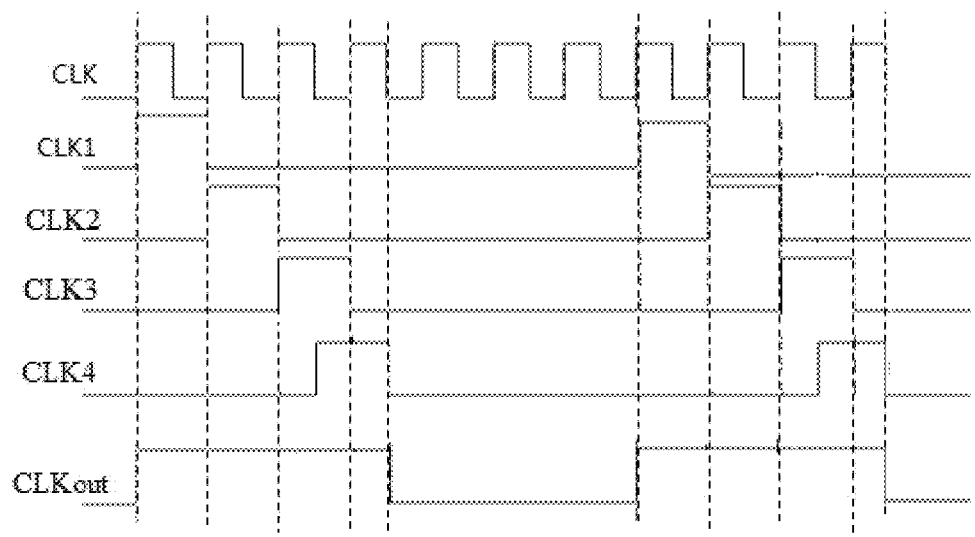
FIG. 3 is a waveform of the frequency divider with a divisor 7 as shown in FIG. 2.

Here frequency division with a divisor 7 is taken as an example. Referring to FIG. 2, FIG. 2 is a schematic block diagram of a frequency divider with a divisor 7 in the embodiment of the present disclosure. As shown in FIG. 2, in order to implement the frequency division with a divisor 7, the D flip-flop unit 120 comprises (n−1)/2=(7−1)/2=3 D flip-flops in a cascaded connection, wherein the first D flip-flop 121 and the second D flip-flop 122 are rising-edge-triggered D flip-flops, and the last D flip-flop 123 is a falling-edge-triggered D flip-flop. Further, referring to FIG. 3, FIG. 3 shows a waveform of the frequency divider with a divisor 7 as shown in FIG. 2. In FIG. 3, the clock signal CLK is a consecutive pulse clock signal with a 50% duty cycle. The non-50%-duty-cycle consecutive integer frequency divider 110 receives the clock signal CLK and the input control signal CB to implement the frequency division with a divisor 7 under control of the input signal CB, and outputs a divide-by-seven clock signal CLK1 with a non-50% duty cycle, that is, the frequency of the clock signal CLK is greater than the frequency of the consecutive frequency division clock signal CLK1 having a non-50% duty cycle. The clock signal CLK2 is a clock signal obtained after the rising-edge-triggered D flip-flop 121 delays the clock signal CLK1 by one pulse period, the clock signal CLK3 is a clock signal obtained after the rising-edge-triggered D flip-flop 122 delays the clock signal CLK2 by one pulse period, and the clock signal CLK4 is a clock signal obtained after the falling-edge-triggered D flip-flop 123 delays the clock signal CLK3 by a half of a clock period. The clock signal CLK1, the clock signal CLK2, the clock signal CLK3, and the clock signal CLK4 are passed through the logic OR gate 130 to output the output clock signal CLKout with a 50% duty cycle, that is, the frequency of the output clock signal CLKout with a 50% duty cycle is the same as the frequency of the consecutive frequency division clock signal CLK1 with a non-50% duty cycle. In the present disclosure, after delaying performed by the D flip-flop unit 120 and an operation performed by the logic OR gate 130, the output clock signal CLKout with a 50% duty cycle is obtained. In this way, a clock signal with a 50% duty cycle of frequency division with any divisor can be implemented by simply adding the D flip-flop unit and the logic OR gate to the periphery of the existing non-50%-duty-cycle consecutive integer frequency divider 110.

The frequency divisor 7 of the 50%-duty-cycle consecutive integer frequency divider as shown in FIG. 2 has n being an odd number. The D flip-flops comprise two rising-edge-triggered D flip-flops 121 and 122 and one falling-edge-triggered D flip-flop 123. The falling-edge-triggered D flip-flop comprises a NOT gate and a rising-edge-triggered D flip-flop. The NOT gate receives and inverts the clock signal CLK, then outputs an inverted clock signal to a clock signal terminal of the rising-edge-triggered D flip-flop. The NOT gate and the rising-edge-triggered D flip-flop constitute the falling-edge-triggered D flip-flop.

Figure 4:
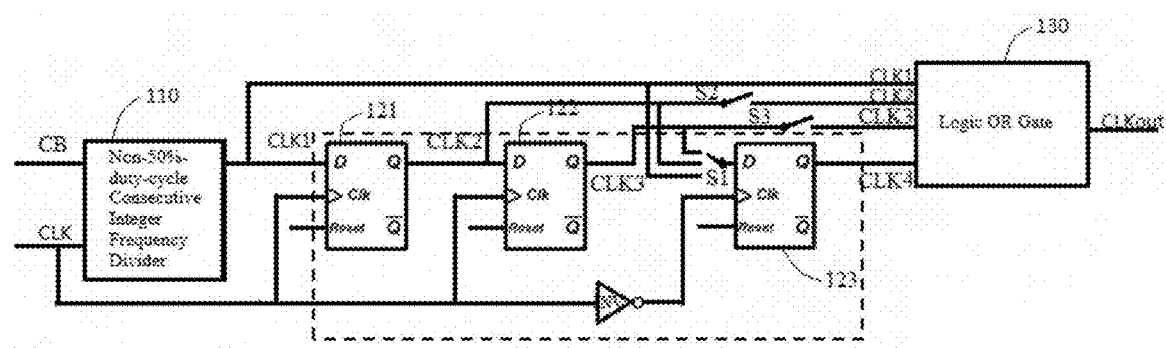
FIG. 4 is a schematic block diagram of a 50%-duty-cycle consecutive integer frequency divider in accordance of another embodiment of the present disclosure.

Specifically, FIG. 4 is a schematic block diagram of a 50%-duty-cycle consecutive integer frequency divider in accordance of another embodiment of the present disclosure. As shown in FIG. 4, a gating switch S1 and switches S2 and S3 are added on the basis of the frequency divider with a divisor 7 as shown in FIG. 2. Specifically, as shown in FIG. 4, a Q output terminal of the rising-edge-triggered D flip-flop 121 in the D flip-flop unit 120 is connected to the input terminal of the logic OR gate 130 through the switch S2, and a Q output terminal of the rising-edge-triggered D flip-flop 122 is connected to the input terminal of the logic OR gate 130 through the switch S3, to selectively output the first delayed clock signal CLK2 and the second delayed clock signal CLK3 to the logic OR gate 130. Moreover, the Q output terminals of the rising-edge-triggered D flip-flop 121 and the rising-edge-triggered D flip-flop 122 in the D flip-flop unit 120 and the output terminal of the non-50%-duty-cycle consecutive integer frequency divider 110 are connected to a D input terminal of the falling-edge-triggered D flip-flop through the gating switch S1, to selectively input, to the input terminal of the falling-edge-triggered D flip-flop, a clock signal outputted by the output terminal of one of the rising-edge-triggered D flip-flop 121, the rising-edge-triggered D flip-flop 122, and the non-50%-duty-cycle consecutive integer frequency divider 110, thereby implementing frequency division with divisors of various odd numbers. When the frequency divider as shown in FIG. 4 is used to implement frequency division with a divisor 5, the gating switch S is selected to connect to the Q output terminal of the rising-edge-triggered D flip-flop 121, the switch S3 is controlled to be turned off, and the switch S2 is turned on, in which case the second delayed clock signal CLK3 is not outputted to the logic OR gate 130, the first delayed clock signal CLK2 and the clock signal CLK1 are outputted to the logic OR gate 130, and the falling-edge-triggered D flip-flop 123 delays the first delayed clock signal CLK2 by a half of a clock period and outputs a delayed clock signal to the logic OR gate 130, thereby implementing the frequency division with a divisor 5. When the frequency divider as shown in FIG. 4 is used to implement frequency division with a divisor 3, the gating switch S1 is selected to connect to the output terminal of the non-50%-duty-cycle consecutive integer frequency divider 110, the switch S3 and the switch S2 are controlled to be turned off, in which case the first delayed clock signal CLK2 and the second delayed clock signal CLK3 are not outputted to the logic OR gate 130, the clock signal CLK1 is outputted to the logic OR gate 130, and the falling-edge-triggered D flip-flop 123 delays the clock signal CLK1 by a half of a clock period and outputs a delayed clock signal to the logic OR gate 130, thereby implementing the frequency division with a divisor 3.

Figure 5:
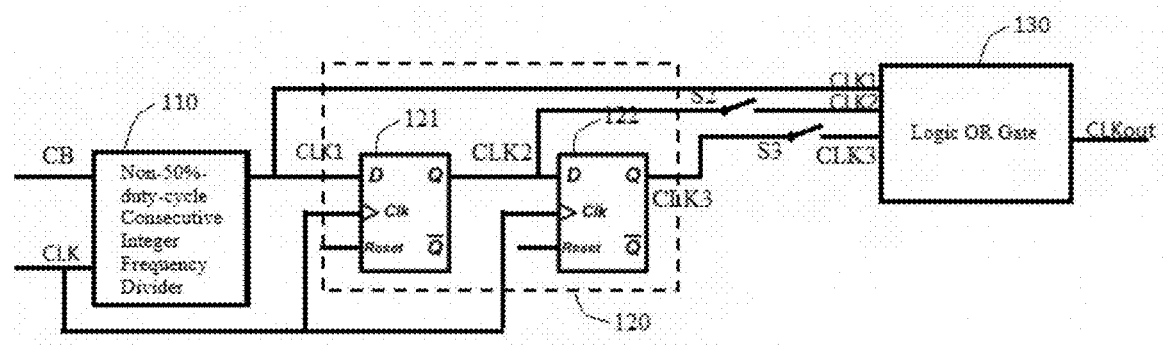
FIG. 5 is a schematic block diagram of a 50%-duty-cycle consecutive integer frequency divider in yet another embodiment of the present disclosure.

Specifically, FIG. 5 is a schematic block diagram of a 50%-duty-cycle consecutive integer frequency divider in yet another embodiment of the present disclosure. The frequency divider as shown in FIG. 5 can implement frequency division with a divisor 6, and can further implement frequency division with divisors 4 and 2 if the switches S2 and S3 are added. Specifically, as shown in FIG. 5, the Q output terminal of the rising-edge-triggered D flip-flop 121 in the D flip-flop unit 120 is connected to the input terminal of the logic OR gate 130 through the switch S2, and the Q output terminal of the rising-edge-triggered D flip-flop 122 is connected to the input terminal of the logic OR gate 130 through the switch S3, to selectively output the first delayed clock signal CLK2 and the second delayed clock signal CLK3 to the logic OR gate 130, thereby implementing frequency division with divisors of different even numbers. In the frequency divider as shown in FIG. 5, if both the switches S2 and S3 are turned on, the frequency division with a divisor 6 can be implemented. If the switch S3 is turned off and the switch S2 is turned on, the frequency division with a divisor 4 can be implemented. If both the switches S2 and S3 are turned off, the frequency division with a divisor 2 can be implemented.

Figure 6:
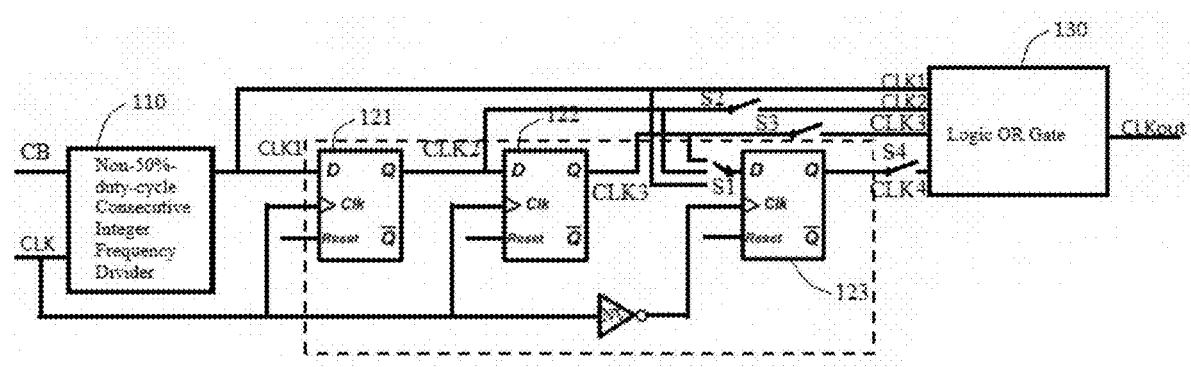
FIG. 6 is a schematic block diagram of a 50%-duty-cycle consecutive integer frequency divider, in accordance with still another embodiment of the present disclosure.

Specifically, FIG. 6 is a schematic block diagram of a 50%-duty-cycle consecutive integer frequency divider in still another embodiment of the present disclosure. As shown in FIG. 6, a switch S4 is added on the basis of the frequency divider with a divisor 7 as shown in FIG. 4. Specifically, as shown in FIG. 6, further, an output terminal of the falling-edge-triggered D flip-flop is connected to an input terminal of the logic OR gate 130 through the switch S4, thereby implementing frequency division with divisors of different odd numbers or even numbers. When the frequency divider as shown in FIG. 6 is used to implement frequency division with a divisor 7, all the switches S2, S3, and S4 are turned on, and the gating switch S1 is selected to connect to the Q output terminal of the rising-edge-triggered D flip-flop 122; to implement frequency division with a divisor 6, the switch S4 is controlled to be turned off, and the switches S2 and S3 are turned on; to implement frequency division with a divisor 5, the gating switch S1 is selected to connect to the Q output terminal of the rising-edge-triggered D flip-flop 121, the switch S3 is controlled to be turned off, and the switches S2 and S4 are turned on. To implement frequency division with a divisor 4, the switches S4 and S3 are controlled to be turned off, and the switch S2 is turned on. To implement frequency division with a divisor 3, the gating switch S1 is selected to connect to the output terminal of the non-50%-duty-cycle consecutive integer frequency divider 110, the switches S2 and S3 are controlled to be turned off, and the switch S4 is turned on. To implement frequency division with a divisor 2, the switches S2, S3, and S4 are controlled to be turned off. In this way, frequency division with different divisors can be implemented.

Figure 7:
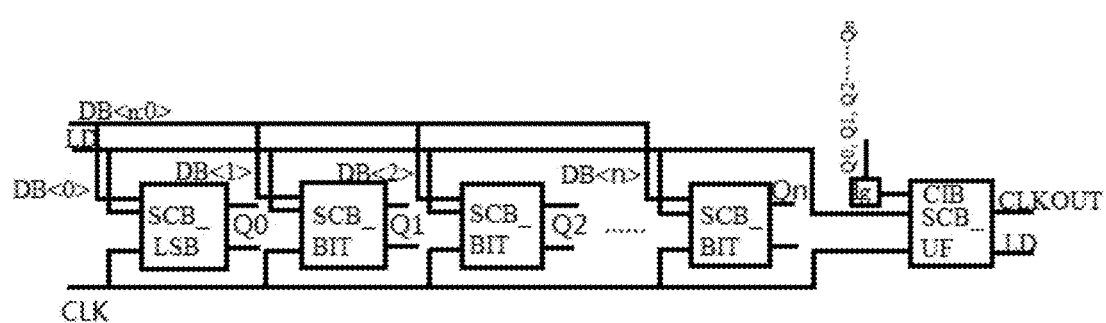
FIG. 7 is a schematic block diagram of a non-50%-duty-cycle consecutive integer frequency divider in one embodiment.
Figure 8:
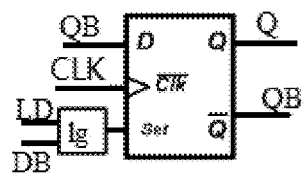
FIG. 8 is a schematic block diagram of an SCB_LSB module.
Figure 9:
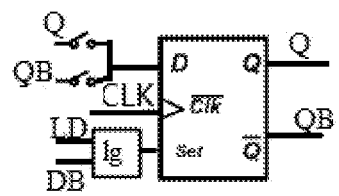
FIG. 9 is a schematic block diagram of an SCB_BIT module.
Figure 10:
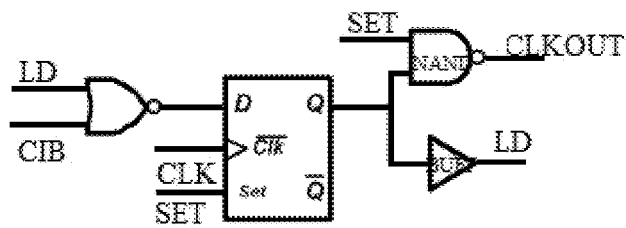
FIG. 10 illustrates a block diagram of an SCB_UF module.

Specifically, in one embodiment of the present disclosure, the non-50%-duty-cycle consecutive integer frequency divider 110 is an M divider or N divider, which outputs a consecutive frequency division clock signal with a non-50% duty cycle. Specifically, FIG. 7 is a schematic block diagram of a non-50%-duty-cycle consecutive integer frequency divider in one embodiment. With reference to FIG. 8, FIG. 9, and FIG. 10, FIG. 8 is a schematic block diagram of an SCB_LSB module, FIG. 9 is a schematic block diagram of a an SCB_BIT module, and FIG. 10 illustrates a structure of an SCB_UF module. As shown in FIG. 7, the non-50%-duty-cycle consecutive integer frequency divider comprises: a counter least-significant-bit modular structure (SCB_LSB), at least one counter high-bit modular structure (SCB_BIT), and an SCB_UF modular structure. A working principle is as follows: a counter can implement binary subtraction counting of any number of bits. In a subtraction counting process, the SCB_UF module maintains a low level output, and when the counting process reaches to a determined period (that is, a binary code is diminished to 00 . . . 010), a logic gate controls output terminals CLKOUT and LD of the SCB_UF module to output a high level, in which case a high-level LD signal is fed back to each module of the counter, and a reset operation is performed on each subtraction counting module, thereby starting a subtraction counting process of a new period. As shown in FIGS. 8 and 9, one modular unit controls 01 binary switching of one bit, and binary subtraction counting of a higher bit can be implemented by increasing the number of high-bit modules. The structure as shown in FIG. 7 totally comprises N modular units, which can implement frequency division of a divisor $2^N-1$, while a duty cycle is $1/(2^N-1)$ instead of 50%.

Figure 11:
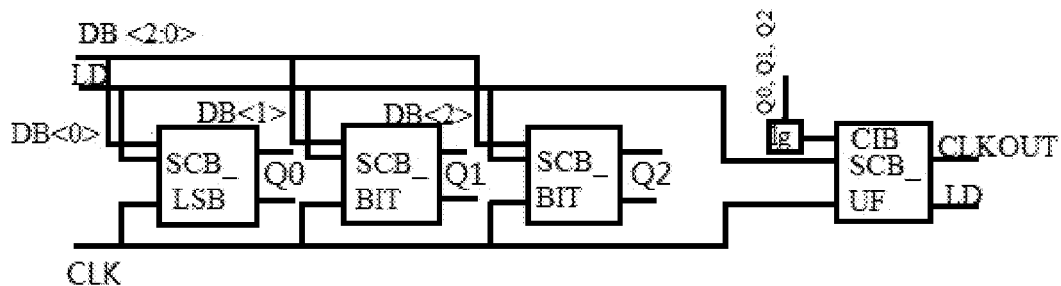
FIG. 11 is a schematic block diagram of a 3_bit frequency divider.
Figure 12:
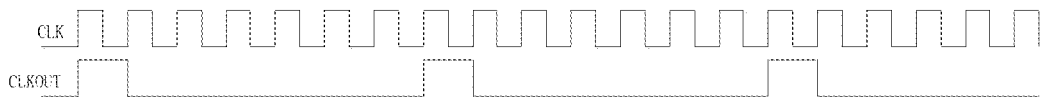
FIG. 12 is a waveform view of a timing sequence of the frequency divider as shown in FIG. 11.

FIG. 11 is a schematic view of a 3_bit frequency divider, which can implement consecutive frequency division of divisors 1 to 7. A principle of implementing frequency division of a divisor 7 is as follows: in this case, a control signal DB<2:0>=111 is inputted, three modular units perform a subtraction operation, when an output of the three modular units is Q<2:0>=010, the LD signal output of the SCB_UF module is "1", and then reset operations are performed on the three subtraction counting modules, thereby starting a subtraction counting process of a new period. A timing sequence of the frequency division of a divisor 7 is as shown in FIG. 12.

Figure 13:
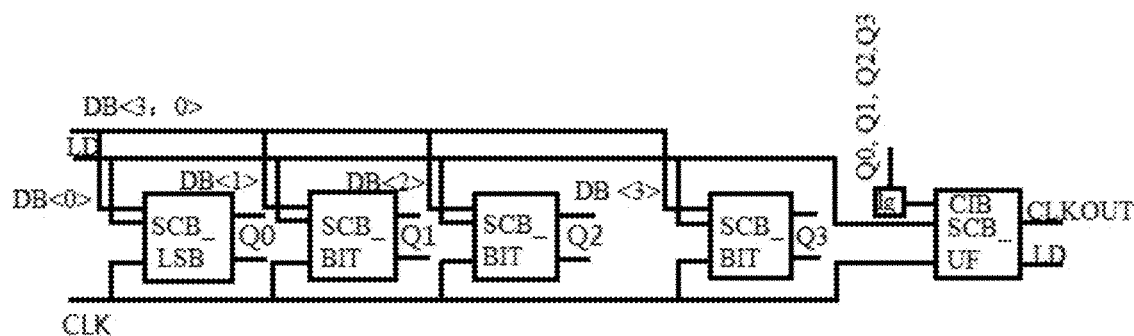
FIG. 13 is a schematic block diagram of a 4_bit frequency divider.
Figure 14:
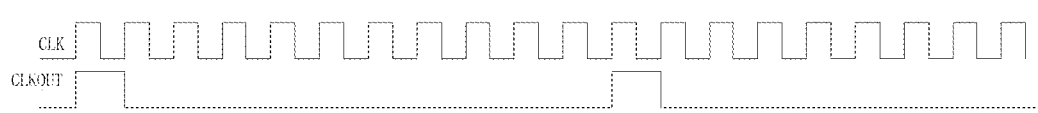
FIG. 14 is a waveform of a timing sequence of the frequency divider as shown in FIG. 13.

FIG. 13 is a schematic view of a 4_bit frequency divider, which can implement consecutive frequency division of divisors 1 to 16. A principle of implementing frequency division of a divisor 11 is as follows: in this case, a signal DB<3:0>=1011 is inputted, four modular units perform a subtraction operation, when an output of the four modular units is Q<3:0>=0010, the LD signal output of the SCB_UF module is "1", and then reset operations are performed on the four subtraction counting modules, thereby starting a subtraction counting process of a new period. A timing sequence of the frequency division of a divisor 11 is as shown in FIG. 14.

The non-50%-duty-cycle consecutive integer frequency divider 110 is not limited in the present disclosure, as long as it can output a consecutive frequency division clock signal with a non-50% duty cycle.

Figure 15:
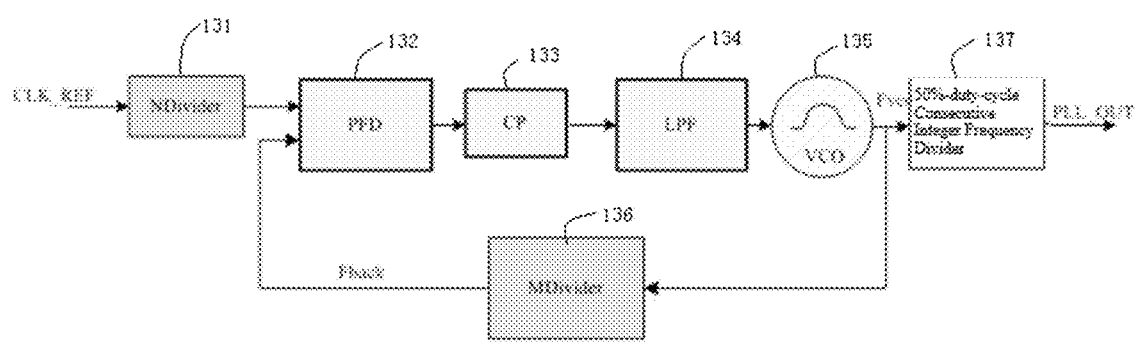
FIG. 15 is a schematic block diagram of a phase-locked loop circuit in accordance of one embodiment of the present disclosure.

Further, another embodiment of the present disclosure provides a phase-locked loop circuit. Specifically, FIG. 15 is a schematic block diagram of the phase-locked loop circuit. As shown in FIG. 15, the phase-locked loop circuit comprises: an N divider 131 used for receiving a reference clock signal CLK_REF; a phase-frequency detector (PFD) 132 connected to an output terminal of the N divider and used for receiving an output signal of the N divider; a charge pump 133 connected to an output terminal of the phase-frequency detector and used for receiving an output signal of the phase-frequency detector; a filter 134 connected to an output terminal of the charge pump and used for receiving an output signal of the charge pump; a voltage-controlled oscillator 135 connected to an output terminal of the filter and used for receiving an output signal of the filter; an M divider 136 having an input terminal connected to an output terminal of the voltage-controlled oscillator and an output terminal connected to an input terminal of the phase-frequency detector (PFD) 132 and used for feeding back an output signal of the voltage-controlled oscillator to the phase-frequency detector (PFD) 132; and a 50%-duty-cycle consecutive integer frequency divider 137 having an input terminal connected to the output terminal of the voltage-controlled oscillator and an output terminal outputting an output signal PLL_OUT of the phase-locked loop circuit.

In this embodiment, the 50%-duty-cycle consecutive integer frequency divider 137 is the 50%-duty-cycle consecutive integer frequency divider as described above, which is not described in detail herein.

To sum up, the D flip-flop unit and the logic OR gate are added to the periphery of the existing non-50%-duty-cycle consecutive integer frequency divider, to delay and perform a logical operation on the consecutive frequency division clock signal with a non-50% duty cycle outputted by the non-50%-duty-cycle consecutive integer frequency divider, thereby implementing a clock signal with a 50% duty cycle of consecutive frequency division with any divisor. First, the circuit structure is simple. Further, the cost is low because modules are added to the periphery of an existing circuit. Furthermore, the number of the added peripheral circuit modules can be selected as needed to implement frequency division with any divisor, thus having high applicability.

Finally, it should be noted that the above embodiments are merely used for illustration of the technical solutions of the present disclosure, but not for limitation. Although the present disclosure is described in detail with reference to the above embodiments, a person of ordinary skill in the art should understand that, he can still make modifications to the technical solutions described in the embodiments, or make equivalent replacements to some or all of the technical features, while these modifications or replacements shall not deviate the essence of the corresponding technical solutions from the ranges of the technical solutions of the embodiments of the present disclosure.

What is claimed is:

1. A consecutive integer frequency divider of 50%-duty-cycle, comprising:
a consecutive integer frequency divider module, wherein the module has a non-50%-duty-cycle, wherein the module receives a clock signal CLK and an input control signal CB and outputs a consecutive frequency division clock signal CLK comprising a non-50% duty cycle;
a D flip-flop module for receiving the clock signal CLK and the consecutive frequency division clock signal CLK1 and outputting at least one clock signal CLKx, wherein x is an integer greater than 1; and
a logic OR gate module for receiving the consecutive frequency division clock signal CLK1 and the at least one clock signal CLKx, and outputting an output clock signal CLKout comprising a 50% duty cycle.

2. The consecutive integer frequency divider of 50%-duty-cycle according to claim 1, wherein the clock signal CLK is a consecutive pulse clock signal having a 50% duty cycle, wherein the at least one clock signal CLKx is a consecutive frequency division clock signal having a non-50% duty cycle, and wherein the at least one clock signal CLKx is a clock signal obtained by delaying the consecutive frequency division clock signal CLK1.

3. The consecutive integer frequency divider of 50%-duty-cycle according to claim 1, wherein a frequency of the clock signal CLK is greater than a frequency of the consecutive frequency division clock signal CLK1, and also greater than a frequency of the at least one clock signal CLKx; and wherein a frequency of the output clock signal CLKout of 50% duty cycle is a same as the frequency of the consecutive frequency division clock signal CLK1.

4. The consecutive integer frequency divider of 50%-duty-cycle according to claim 3, wherein a frequency divisor of the non-50%-duty-cycle consecutive integer frequency divider is a same as a frequency divisor of the 50%-duty-cycle consecutive integer frequency divider.

5. The consecutive integer frequency divider of 50%-duty-cycle according to claim 4, wherein the frequency divisor of the non-50%-duty-cycle consecutive integer frequency divider is controlled by the input control signal CB.

6. The consecutive integer frequency divider of 50%-duty-cycle according to claim 1, wherein the D flip-flop module comprises a plurality of D flip-flops in a cascaded connection, wherein the plurality of D flip-flops comprises a first D flip-flop, a front D flip-flop, and a rear D flip-flop;
wherein the first D flip-flop receives the consecutive frequency division clock signal CLK1 having a non-50% duty cycle and the clock signal CLK to delay the consecutive frequency division clock signal CLK1 and outputs a first delayed clock signal CLK2; and
wherein the rear D flip-flop is connected to the front D flip-flop, wherein the rear D flip-flop has a D input terminal for receiving an output signal from a Q terminal of the front D flip-flop and the clock signal CLK, wherein the rear D flip-flop delays an output signal of the Q terminal of the front D flip-flop, and sequentially outputs a delayed clock signal.

7. The consecutive integer frequency divider of 50%-duty-cycle according to claim 6, wherein when a frequency divisor n of the 50%-duty-cycle consecutive integer frequency divider is an even number greater than 2, a number of the plurality of D flip-flops is (n−2)/2.

8. The consecutive integer frequency divider of 50%-duty-cycle according to claim 7, wherein the (n−2)/2 D flip-flops are rising-edge-triggered D flip-flops.

9. The consecutive integer frequency divider of 50%-duty-cycle according to claim 8, wherein a Q output terminal of each rising-edge-triggered D flip-flop in the D flip-flop module is connected to an input terminal of the logic OR gate module through a switch, to selectively output the first delayed clock signal CLK2 to the $(X-1)^{th}$ delayed clock signal CLKx to the logic OR gate module.

10. The consecutive integer frequency divider of 50%-duty-cycle according to claim 6, wherein when the frequency divisor n of the 50%-duty-cycle consecutive integer frequency divider is an odd number greater than or equal to 3, the number of the plurality of D flip-flops is [(n−3)/2]+1.

11. The consecutive integer frequency divider of 50%-duty-cycle according to claim 10, wherein (n−3)/2 D flip-flops are rising-edge-triggered D flip-flops, and a single D flip-flop is a falling-edge-triggered D flip-flop.

12. The consecutive integer frequency divider of 50%-duty-cycle according to claim 11, wherein the falling-edge-triggered D flip-flop comprises a NOT gate and a rising-edge-triggered D flip-flop; the NOT gate receives the clock signal CLK, inverts the clock signal CLK, and then outputs the inverted clock signal to a clock signal terminal of the rising-edge-triggered D flip-flop; and wherein the NOT gate and the rising-edge-triggered D flip-flop constitute the falling-edge-triggered single D flip-flop.

13. The consecutive integer frequency divider of 50%-duty-cycle according to claim 12, wherein the falling-edge-triggered D flip-flop is the rear of the plurality of D flip-flops in the D flip-flop module and is used to output the $(X-1)^{th}$ delayed clock signal CLKx.

14. The consecutive integer frequency divider of 50%-duty-cycle according to claim 13, wherein a Q output terminal of each rising-edge-triggered D flip-flop in the D flip-flop module is connected to an input terminal of the logic OR gate module through a switch, to selectively output the first delayed clock signal CLK2 to the $(X-2)^{th}$ delayed clock signal CLK to the logic OR gate module; and wherein the Q output terminals of all the rising-edge-triggered D flip-flops and an output terminal of the non-50%-duty-cycle consecutive integer frequency divider are connected to a D input terminal of the falling-edge-triggered D flip-flop through a gating switch, to selectively input, to the input terminal of the falling-edge-triggered D flip-flop, a clock signal outputted by the output terminal of one of all the rising-edge-triggered D flip-flops or the non-50%-duty-cycle consecutive integer frequency divider.

15. The consecutive integer frequency divider of 50%-duty-cycle according to claim 6, wherein a number of the D flip-flops increases with an increase of the frequency divisor n of the 50%-duty-cycle consecutive integer frequency divider, wherein n is an integer greater than or equal to 2.

16. The consecutive integer frequency divider of 50%-duty-cycle according to claim 15, wherein a frequency divisor of the 50%-duty-cycle consecutive integer frequency divider is n, n being an integer greater than or equal to 2; wherein a number of the D flip-flops in a cascaded connection is (n−1)/2, the front [(n−1)/2]−1 D flip-flops are rising-edge-triggered D flip-flops, and the rear single D flip-flop is a falling-edge-triggered D flip-flop; wherein the falling-edge-triggered D flip-flop is the last stage of the D flip-flop module; wherein a Q output terminal of each D flip-flop in the D flip-flop unit is connected to an input terminal of the logic OR gate module through a switch, to selectively output the first delayed clock signal CLK2 to the $(X-1)^{th}$ delayed clock signal CLKx to the logic OR gate; and wherein a gating switch is provided to connect to a D input terminal of the falling-edge-triggered D flip-flop, to selectively connect any one of the first delayed clock signal CLK2 to the (X−1)$^{th}$ delayed clock signal CLKx or the consecutive frequency division clock signal CLK having a non-50% duty cycle.

17. The consecutive integer frequency divider of 50%-duty-cycle according to claim 1, wherein the non-50%-duty-cycle consecutive integer frequency divider is an M divider, which outputs a consecutive frequency division clock signal having a non-50% duty cycle.

18. The consecutive integer frequency divider of 50%-duty-cycle according to claim 1, wherein the non-50%-duty-cycle consecutive integer frequency divider is an N divider, which outputs a consecutive frequency division clock signal having a non-50% duty cycle.

19. A phase-locked loop circuit, comprising:
an N divider for receiving a reference clock signal CLK_REF;
a phase-frequency detector connected to an output terminal of the N divider, wherein the phase-frequency detector receives an output signal of the N divider;
a charge pump connected to an output terminal of the phase-frequency detector, wherein the charge pump receives an output signal of the phase-frequency detector;
a filter connected to an output terminal of the charge pump for receiving an output signal of the charge pump;
a voltage-controlled oscillator connected to an output terminal of the filter for receiving an output signal of the filter;
an M divider comprising: an input terminal connected to an output terminal of the voltage-controlled oscillator, and an output terminal connected to an input terminal of the phase-frequency detector for feeding back an output signal of the voltage-controlled oscillator to the phase-frequency detector; and
a consecutive integer frequency divider of 50%-duty-cycle comprising an input terminal connected to the output terminal of the voltage-controlled oscillator, and an output terminal outputting an output signal PLL_OUT of the phase-locked loop circuit.

20. The phase-locked loop circuit according to claim 19, wherein the consecutive integer frequency divider of 50%-duty-cycle is configured according to claim 1.

* * * * *